(12) United States Patent
Balmin et al.

(10) Patent No.: US 9,400,767 B2
(45) Date of Patent: Jul. 26, 2016

(54) SUBGRAPH-BASED DISTRIBUTED GRAPH PROCESSING

(71) Applicant: International Business Machines Corporation, Armonk, NY (US)

(72) Inventors: Andrey Balmin, San Jose, CA (US); Severin A. Corsten, Bornheim (DE); John A McPherson, Jr., San Jose, CA (US); Shirish Tatikonda, San Jose, CA (US); Yuanyuan Tian, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 220 days.

(21) Appl. No.: 14/108,812

(22) Filed: Dec. 17, 2013

(65) Prior Publication Data

US 2015/0170316 A1    Jun. 18, 2015

(51) Int. Cl.
  *G06F 15/16*  (2006.01)
  *G06F 17/10*  (2006.01)
  *G06F 17/30*  (2006.01)
  *G06F 17/50*  (2006.01)

(52) U.S. Cl.
  CPC .......... *G06F 17/10* (2013.01); *G06F 17/30958* (2013.01); *G06F 17/509* (2013.01)

(58) Field of Classification Search
  CPC ........ G06T 1/20; G06T 15/005; G09G 5/363; G09G 5/393; G06F 3/14
  USPC ........................................................ 345/503
  See application file for complete search history.

(56) References Cited

U.S. PATENT DOCUMENTS

| | | | |
|---|---|---|---|
| 2008/0049022 A1* | 2/2008 | Sherb | G06Q 10/06 345/440 |
| 2011/0078652 A1* | 3/2011 | Mani | G06F 8/10 717/105 |
| 2012/0239797 A1 | 9/2012 | Agrawal et al. | |
| 2013/0024412 A1 | 1/2013 | Gong et al. | |
| 2013/0024479 A1 | 1/2013 | Gong et al. | |

OTHER PUBLICATIONS

Y. Tian, et al., From "Think Like a Vertex" to "Think Like a Graph," The Proceedings of the VLDB Endowment (PVLDB, 7(3), 2013; 12 pages.

(Continued)

*Primary Examiner* — Devona Faulk
*Assistant Examiner* — Nicole Gillespie
(74) *Attorney, Agent, or Firm* — Cantor Colburn LLP

(57) ABSTRACT

Embodiments relate to subgraph-based distributed graph processing. An aspect includes receiving an input graph comprising a plurality of vertices. Another aspect includes partitioning the input graph into a plurality of subgraphs, each subgraph comprising internal vertices and boundary vertices. Another aspect includes assigning one or more respective subgraphs to each of a plurality of workers. Another aspect includes initiating processing of the plurality of subgraphs by performing a series of processing steps comprising: processing the internal vertices and boundary vertices internally within each of the subgraphs; detecting that a change was made to a boundary vertex of a first subgraph during the internal processing; and sending a message from a first worker to which the first subgraph is assigned to a second worker to which a second subgraph is assigned in response to detecting the change that was made to the boundary vertex of the first subgraph.

14 Claims, 8 Drawing Sheets

(56) References Cited

OTHER PUBLICATIONS

D. Lasalle, et al., "Multi-Threaded Graph Partitioning," 27th IEEE International Parallel and Distributed Processing Symposium, 2013; pp. 1-12.

A. Schwing, et al., "Distributed Message Passing for Large Scale Graphical Models," Computer Vision and Pattern Recognition (CVPR), 2011 IEEE Conference Jun. 20-25, 2011 pp. 1833-1840.
G. Yu, et al., "Large Scale Graph Data Processing on Cloud Computing Environments," Chinese Journal of Computers, vol. 34, No. 10.; Oct. 2011; pp. 1-15.

* cited by examiner

SUBGRAPH-BASED DISTRIBUTED GRAPH PROCESSING

BACKGROUND

The present disclosure relates generally to distributed graph processing, and more specifically, subgraph-based distributed graph processing.

Analysis of graph, or network, data is relatively complex for large datasets. To meet the challenge of processing large amounts of graph data, a number of distributed graph processing systems have emerged, such as Pregel™ and GraphLab™. Such graph processing systems divide input graphs into partitions, and employ a vertex-based programming model to support iterative graph computation. In a vertex-based graph processing system, each vertex contains information about itself and all its outgoing edges, and computation is performed at the level of a single vertex. For example, in Pregel, a common vertex-centric computation involves receiving messages from other vertices, updating the state of the vertex and associated edges, and sending messages to other vertices. In GraphLab, a vertex may read or update the vertex's own data or data of its neighbor vertices. In the vertex-centric model, a vertex has limited information. Each vertex only knows about its own neighborhood, and information is propagated through neighbor vertices one hop at a time.

BRIEF SUMMARY

Embodiments include a method, system, and computer program product for subgraph-based distributed graph processing. An aspect includes receiving an input graph comprising a plurality of vertices and edges. Another aspect includes partitioning the input graph into a plurality of subgraphs, each subgraph comprising internal vertices that are owned by the subgraph, and boundary vertices, each of the boundary vertices corresponding an internal vertex that is owned by another subgraph, wherein each vertex in the input graph is owned by a single respective subgraph. Another aspect includes assigning one or more respective subgraphs to each of a plurality of workers of a distributed graph processing system. Another aspect includes initiating processing of the plurality of subgraphs by performing a series of processing steps, wherein a processing step comprises: processing the internal vertices and boundary vertices internally within each of the subgraphs, wherein each of the workers performs the internal processing of each worker's respective one or more subgraphs; detecting that a change was made to a boundary vertex of a first subgraph during the internal processing; and sending a message from a first worker to which the first subgraph is assigned to a second worker to which a second subgraph is assigned in response to detecting the change that was made to the boundary vertex of the first subgraph.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the disclosure are apparent from the following detailed description taken in conjunction with the accompanying drawings in which:

DETAILED DESCRIPTION

Figure 1A:
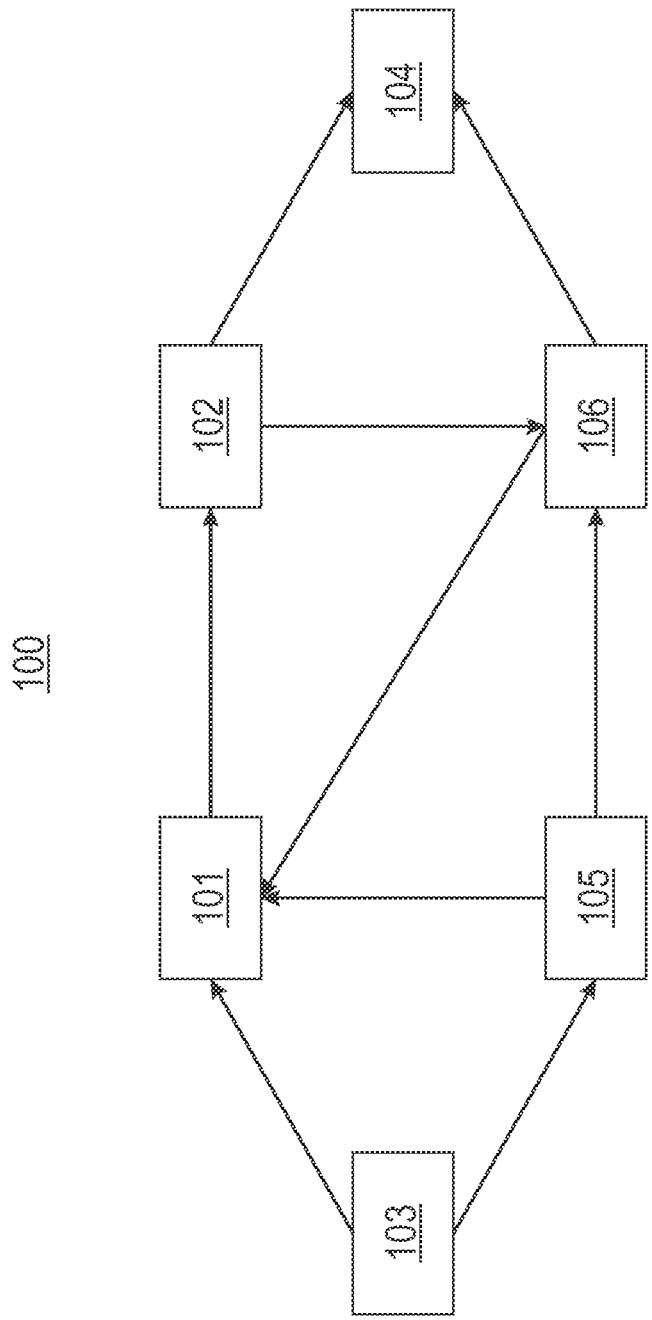
FIG. 1A depicts a graph in accordance with an embodiment.

Embodiments described herein are directed to subgraph-based distributed graph processing. An input graph is partitioned into a plurality of partitions, each partition comprising a subgraph of the input graph, for distributed processing by a plurality of workers in the distributed graph processing system. Subgraph-based distributed graph processing makes use of structural information inside of each partition. A subgraph includes internal vertices, which are owned by the subgraph, and boundary vertices, which are connected to one or more internal vertices in the subgraph but are owned by another subgraph. Operations involving internal vertices are performed internally to the subgraph, and messaging is only required for operations involving boundary vertices. This reduces the total amount of messaging required to process the graph, which may reduce total processing time, as communication between vertices within a partition does not require message passing or scheduling machinery.

The subgraph-based distributed graph processing system includes a plurality of workers, which may comprise a plurality of computers or processors. One of the workers may act as a master worker that coordinates the remaining slave workers. The master worker partitions the input graph into the plurality of partitions, or subgraphs. In embodiments in which the distributed graph processing system is processing a relatively large input graph that does not fit in the memory of a single worker, the input graph may be partitioned by multiple workers. Each subgraph comprises a set of internal vertices, the internal vertices' respective outgoing edges, and the boundary vertices that are linked to the internal vertices via the outgoing edges. Each vertex in a graph is uniquely identified by a vertex identifier, which may comprise, for example, a string or a number. In some embodiments, the master worker uses a hash of a vertex's identifier to assign the vertex to a partition; however, such a hash-based partitioning strategy may create random partitions. A range-based partitioning algorithm may be used in some embodiments to create partitions of directly connected vertices, which enables relatively efficient processing of internal vertices within each subgraph. In range-based partitioning, the internal vertices in each subgraph may correspond to a set, or range, of vertices having consecutive vertex identifiers. Messages for operations involving boundary vertices may also be routed between workers.

After the subgraphs are distributed among the workers, a series of processing steps, which may be referred to as supersteps, are performed until processing of the input graph is completed. The supersteps are separated by global synchronization barriers. In a superstep, all processing that can be performed for internal vertices within each of the plurality of subgraphs is completed; then messages regarding boundary vertices are exchanged between subgraphs, and operations are performed based on those messages.

The number of partitions may be greater than the number of workers in some embodiments, so that each worker can work on multiple partitions at the same time. In some embodiments, worker may utilize multiple processing threads in a thread pool, and each thread within a worker may work on a respective partition. If two subgraphs are being handled by threads within the same worker, messages between the two subgraphs may be accessed asynchronously in the same superstep via, for example, a local buffer memory of the worker.

In some embodiment, the data type of the vertex attributes in the input graph may comprise a wrapper class type, for example, Integer, Double, Long, Float, Short, Byte or Boolean in java. In such an embodiment, the subgraph-based distributed graph processing system may automatically convert the data type of the vertex attributes to a primitive type such as int, double, long, float, short, byte, or boolean. In addition, collections of objects of the wrapper class type are automatically converted into more efficient data structures, such as arrays, using the corresponding primitive type. Use of a primitive type for vertex attributes and array data structures simplifies processing of the input graph.

Figure 1B:
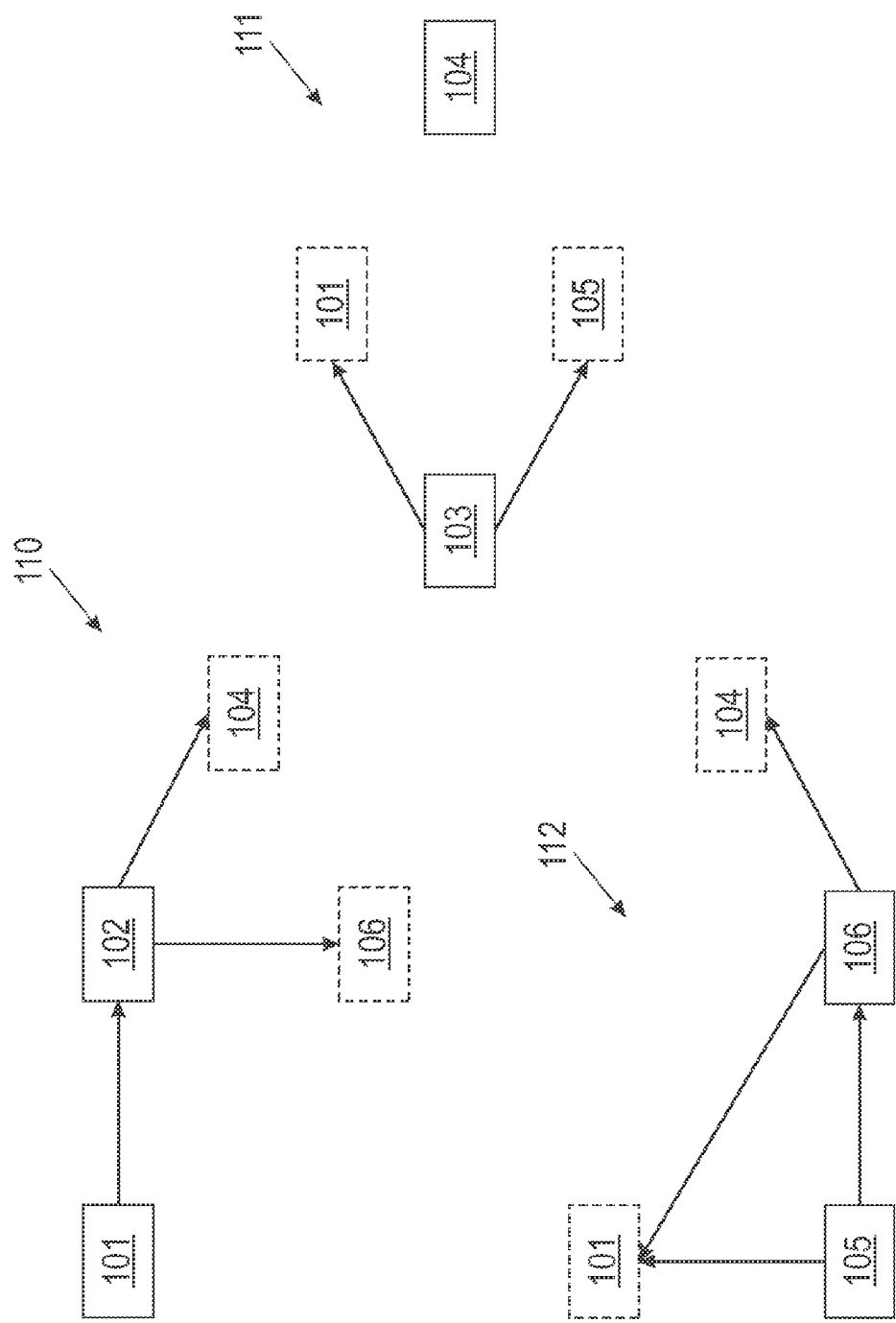
FIG. 1B depicts subgraphs of the graph of FIG. 1A in accordance with an embodiment.

FIG. 1A illustrates an embodiment of a graph 100, and FIG. 1B illustrates an embodiment of the graph 100 after partitioning into subgraphs 110, 111, and 112. Graph 100 includes vertices 101, 102, 103, 104, 105, and 106, which are connected as shown in FIG. 1A. As shown FIG. 1B, subgraph 110 includes internal vertices 101 and 102, and boundary vertices 104 and 106. Subgraph 111 includes internal vertices 103 and 104, and boundary vertices 101 and 105. Subgraph 112 includes internal vertices 105 and 106, and boundary vertices 101 and 104. Internal vertices of a subgraph are those with full neighborhood information inside the subgraph, whereas boundary vertices are those that appear in the neighbor list of an internal vertex. A vertex can appear in multiple subgraphs, but is only an internal vertex in exactly one subgraph. The subgraph in which a vertex is an internal vertex is the owner of the vertex. The owner of a vertex is decided by the partitioner. As an example, although vertex 101 appears in all the three subgraphs 110-112 in FIG. 1, it is only an internal vertex in 110, and is a boundary vertex in both subgraphs 111 and 112, thus the owner of A is subgraph 110. A boundary vertex in a subgraph comprises a local copy of an internal vertex in that is owned by another subgraph; the master copy of a vertex is stored in the subgraph in which the vertex is an internal vertex. For example, boundary vertices 104 and 106 in subgraph 110 are local copies within subgraph 110 of the internal vertex 104 in subgraph 111 and internal vertex 106 in subgraph 112 respectively. If a change is made to boundary vertices 104 in subgraph 110, a message is sent between subgraph 110 and subgraph 111 regarding the change. Processing of internal vertex 104 in subgraph 111 is then performed within subgraph 111 based on the message. The message may be routed between subgraph 110 and subgraph 111 by a master worker in some embodiments. Each internal vertex of a partition may have one of two states, e.g., active or inactive, during processing. However, a boundary vertex does not have any state.

Figure 2:
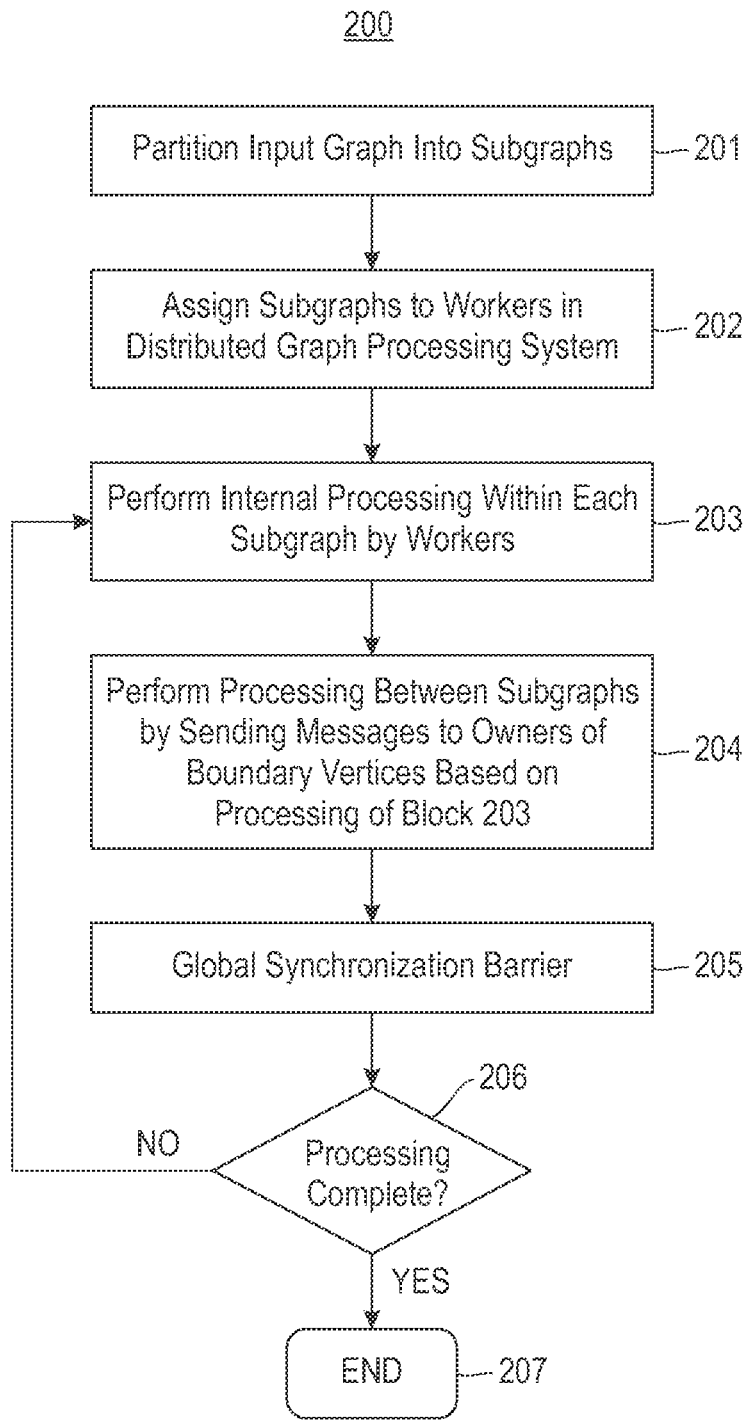
FIG. 2 depicts a flowchart of a method for subgraph-based distributed graph processing in accordance with an embodiment

FIG. 2 illustrates a flowchart of an embodiment of a method 200 for subgraph-based distributed graph processing. First, in block 201, the graph is partitioned into a plurality of subgraphs. Each of the plurality of subgraphs is made up of internal vertices and boundary vertices, such as were shown with respect to FIGS. 1A-B. Partitioning may be performed in any appropriate manner, and may be performed by a single master worker, or in a distributed manner by multiple workers, in various embodiments. First, a number of partitions is determined, and the input graph is divided into subgraphs corresponding to the determined number of partitions. In some embodiments, hash-based partitioning based on the vertex identifiers may be used. In other embodiments, range-based partitioning based on the vertex identifiers may be used. Range based partitioning may reduce the number of edges that connect different subgraphs, which may reduce the number of messages that are needed between subgraphs between processing. Each subgraph comprises internal vertices, which are owned solely by the subgraph, outgoing edges of the internal vertices, and boundary vertices that are directly connected to the internal vertices via the outgoing edges. Each boundary vertex in a subgraph is a local copy corresponding to an internal vertex that is owned by another subgraph. During partitioning, the attributes of the plurality of vertices may be converted from a wrapper class type to a primitive type in some embodiments. Collections of objects of the wrapper class type may be converted to more efficient data structures, such as arrays, using the primitive type in some embodiments.

Next, in block 202, the partitions, or subgraphs, are assigned to workers in the distributed graph processing system. A worker may comprise a computer or processor, and may comprise a simultaneous multithreaded processor in some embodiments. A worker may be assigned multiple subgraphs to process concurrently in some embodiments.

Then, flow proceeds to block 203, in which internal processing is performed by each of the workers on the worker's assigned subgraph(s). Processing involving internal vertices within a subgraph is completed in block 203. For processing involving a boundary vertex, changes are made to the local copy of the data for the boundary vertex that is stored within the subgraph. Then, in block 204, processing is performed between subgraphs by sending messages regarding changes that were made to boundary vertices to the workers that are processing the subgraphs that own the boundary vertices. The changes made to boundary vertices are thereby propagated to the subgraph in which a boundary vertex is an internal vertex. Block 204 is discussed in further detail below with respect to FIG. 3. Then, in block 205, all of the workers complete processing for the current superstep, and there is a global synchronization barrier. In some embodiments of the global synchronization barrier, the master worker tracks which workers have completed processing for the current superstep, and when all of the workers have completed processing for the current superstep, the master worker indicates to the other workers that the superstep has completed. Blocks 203-205 comprise a single superstep in the overall processing of the graph. Flow then proceeds to block 206, in which it is determined whether processing of the input graph is complete. The determination of block 206 may be made by the master worker in some embodiments, and be made based on whether all of the vertices in the input graph are at an inactive state in some embodiments. If it is determined in block 206 that processing of the input graph is not complete, flow proceeds from block 206 back to block 203, and blocks 203-205 are performed concurrently by each of the workers within the distributed graph processing system in the next superstep. Supersteps comprising blocks 203-206 are repeated until it is determined in block 206 that processing of the input graph is complete, at which point flow proceeds to block 207, and method 200 ends.

Figure 3:
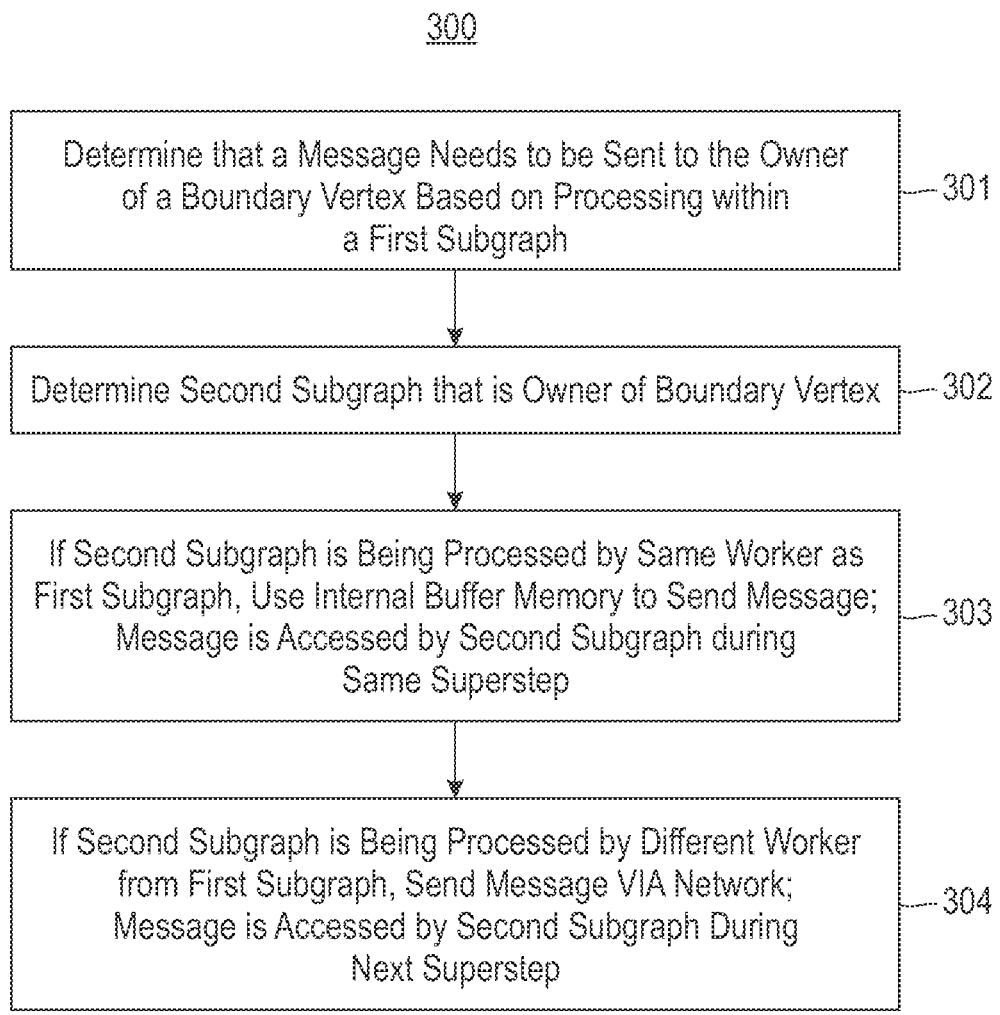
FIG. 3 depicts a flowchart of a method of sending a message during subgraph-based distributed graph processing in accordance with an embodiment.

FIG. 3 depicts a flowchart of an embodiment of a method 300 of sending a message during subgraph-based distributed graph processing. First, in block 301, the worker that is processing a first subgraph determines that there was a change to a boundary vertex in the first subgraph during the internal processing of the first subgraph (such as was performed in block 203 of FIG. 2), and that a message regarding the change needs to be sent to the owner of the boundary vertex. Next, in block 302, a second subgraph that owns the boundary vertex is determined, and the worker that is processing the second subgraph is also determined. The second subgraph is the subgraph in which the boundary vertex is an internal vertex; each vertex in the input graph is only an internal vertex in a single subgraph. In block 303, if the worker that is processing the second subgraph that was determined in block 302 is the same as the worker that is processing the first subgraph, a message regarding the change is routed by the worker to the second subgraph from the first subgraph via, for example, a local buffer memory located within the worker. The message may then be accessed in the local memory by the second subgraph during the same superstep during which the message was sent. In block 304, if the worker that is processing the second subgraph that was determined in block 302 is different from the worker that is processing the first subgraph, a message regarding the change is sent to the second subgraph from the first subgraph via, for example, a network. The message may then be accessed by the second subgraph during the next superstep.

In some embodiments, the processing as described in method 200 of FIG. 2 may be performed as follows. In block 202, when the subgraphs are assigned to workers, the label value associated with each vertex is initialized the vertex's respective vertex identifier, and each vertex's status is set to active. Then, in the supersteps comprising blocks 203 and 204, first, in block 203, each internal vertex sends its label to its neighbor vertices on each outgoing edge within the vertex's subgraph. Each internal and boundary vertex then computes the minimum value of the vertex's received labels, and, if the minimum value is less than the vertex's label, the vertex updates its label with the minimum value. Then, in block 204, if a boundary vertex updated its label in block 203, a message regarding the update is sent to the owner of the internal vertex corresponding to the boundary vertex, and internal vertices then compute the minimum and perform label updating based on the received messages. If a vertex was not changed in block 204, the vertex may change its status to inactive. Processing may be determined to be complete in block 206 when all vertices in the input graph are inactive. This is illustrated with respect to FIGS. 4A-B, which illustrate an example 400A of execution of a weakly connected component (WCC) algorithm as performed using vertex-based processing (FIG. 4A), and an example 400B of subgraph-based processing according to an embodiment (FIG. 4B).

Figure 4A:
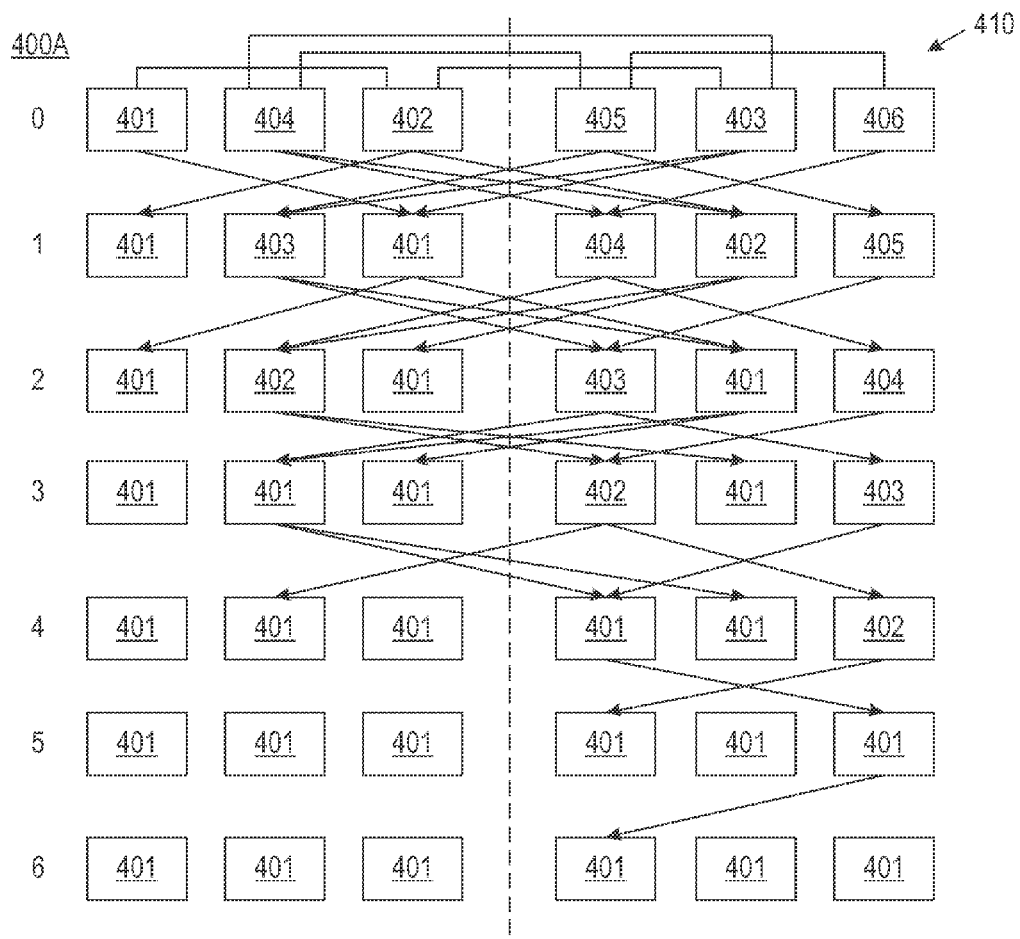
FIG. 4A depicts an example of vertex-based distributed graph processing.
Figure 4B:
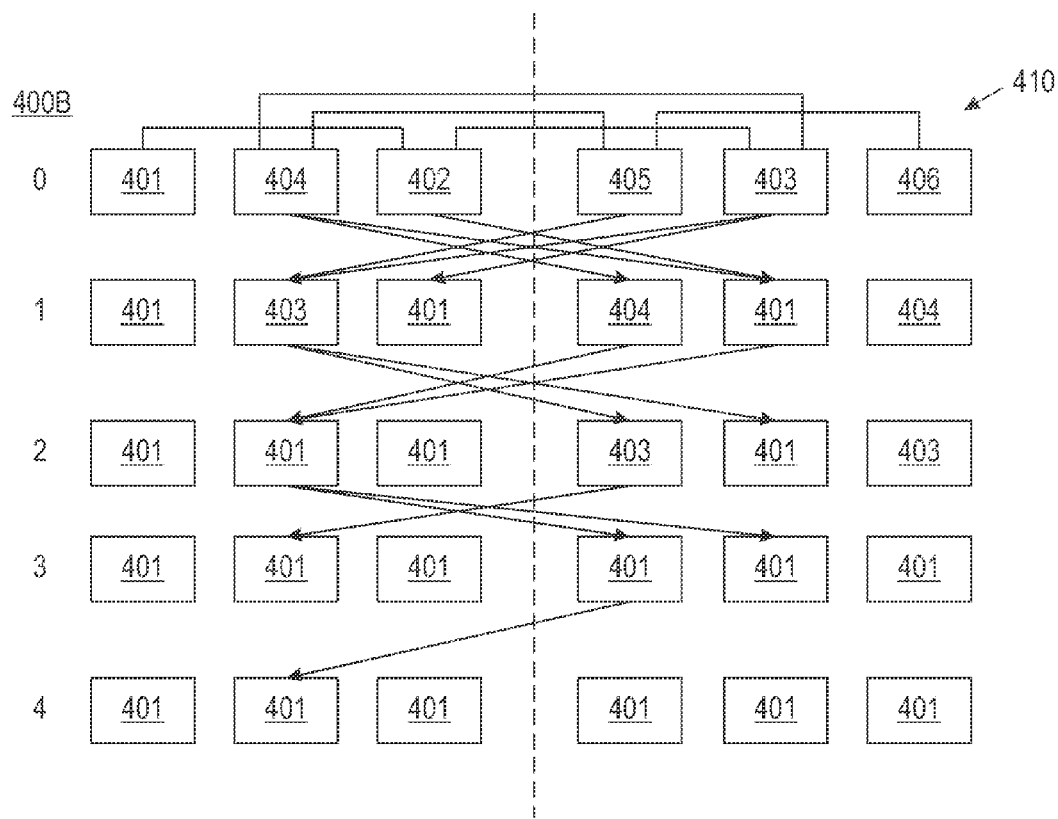
FIG. 4B depicts an example of subgraph-based distributed graph processing in accordance with an embodiment.

In each of FIGS. 4A-B, each row represents the state of a graph after completion of a given superstep. Initially (i.e., at superstep 0), a graph including vertices 401-406, with that are interconnected by connections 410, is divided into two subgraphs. The first subgraph includes vertices 401, 404, and 402; the second subgraph includes vertices 405, 403, and 406. Connections 410 connect vertex 401 to vertex 402; vertex 404 to vertex 405 and vertex 403; vertex 402 to vertex 401 and vertex 403; vertex 405 to vertex 404 and vertex 406; vertex 403 to vertex 404 and vertex 402; and vertex 406 to vertex 405. Then, in each superstep, messages, represented by arrows, are sent between the connected vertices. The messages are sent both between the first and second subgraphs, and internally to the first and second subgraphs. Messages are sent in each of supersteps 1-6 until processing is completed and each of the vertices holds the value of the lowest vertex, indicating that all of the vertices are interconnected. In FIG. 4B, at each superstep, internal processing of the first and second subgraphs is performed first, and messages are only sent between subgraphs after internal processing is completed, as discussed with respect to methods 200 and 300 of FIGS. 2-3. Only 4 supersteps are required to complete processing in FIG. 4B, and a reduced number of messages are required as compared to FIG. 4A.

Figure 5:
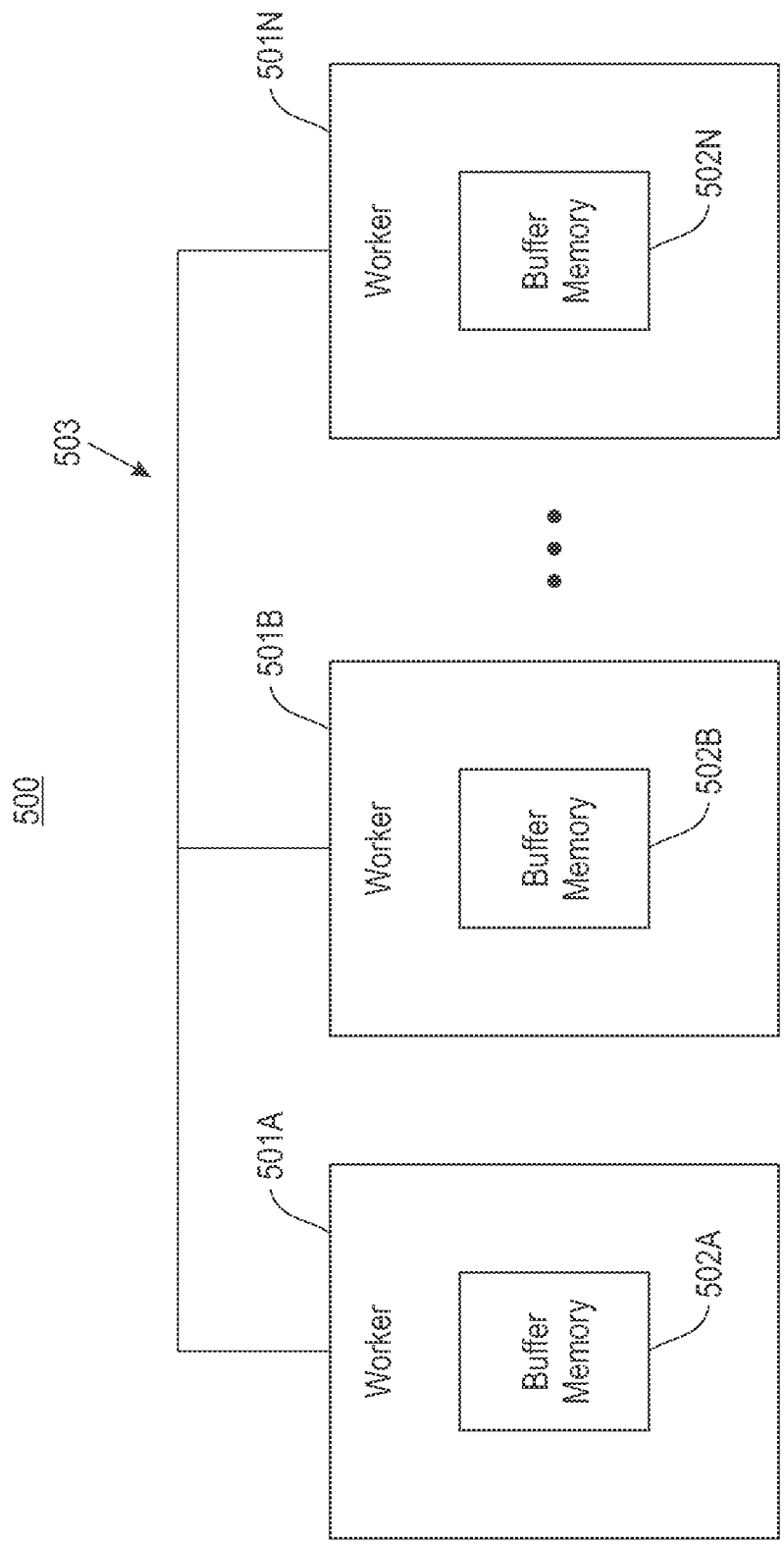
FIG. 5 depicts a distributed computing system for subgraph-based distributed graph processing in accordance with an embodiment.

FIG. 5 illustrates an embodiment of a distributed computing system 500 for subgraph-based distributed graph processing. Distributed computing system 500 may comprise, for example, a cluster of servers, and may implement method 200 of FIG. 2 and method 300 of FIG. 3 as described above. Computer system 500 includes a plurality of workers 501A-N that are interconnected by a network 503. Each of the workers 501A-N may comprise multiple processing threads in some embodiments, and also include a respective internal buffer memory 502A-N. Each of the workers 501A-N may process one or more respective subgraphs concurrently using the worker's multiple processing threads. For a message that is sent between subgraphs that are owned by the same worker of workers 501A-N, the message may be sent via the worker's respective buffer memory of buffer memories 502A-N. For a message that is sent between subgraphs that are being processed by different workers of workers 501A-N, the message is sent via network 503. A worker of the plurality of workers 501A-N may be designated as a master worker in some embodiments; the master worker may perform partitioning of the input graph into subgraphs, and may also route messages via network 503.

Figure 6:
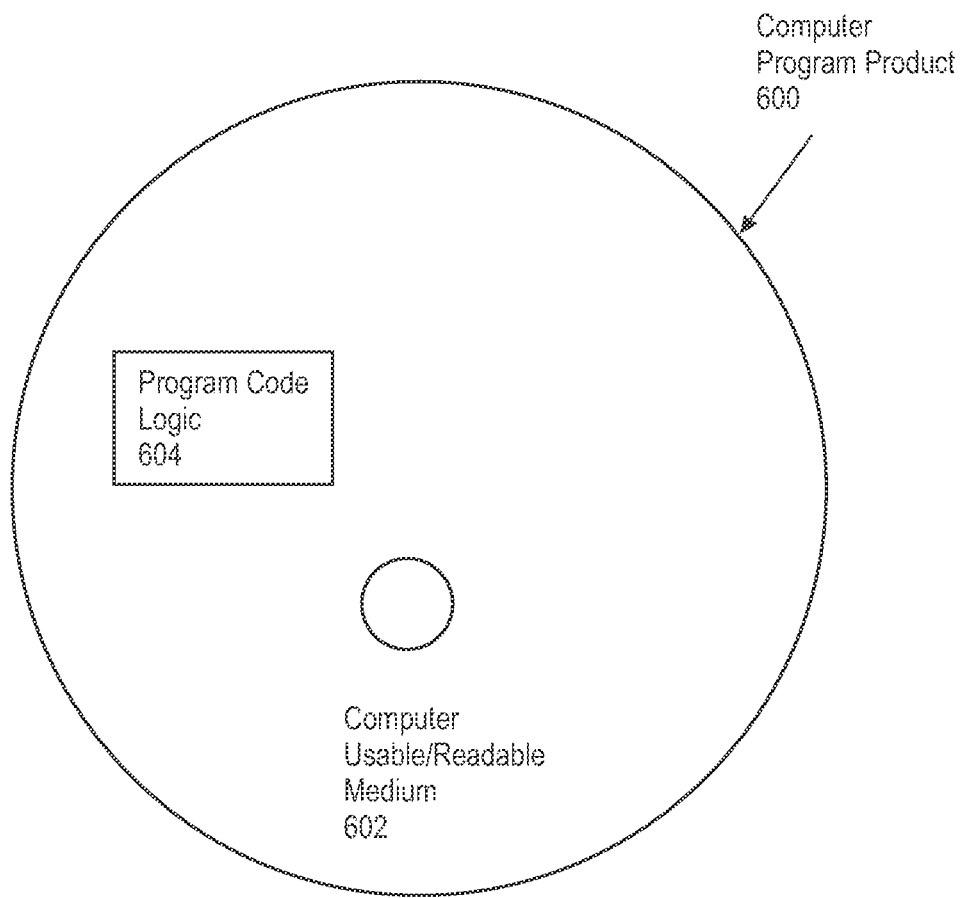
FIG. 6 illustrates a computer program product in accordance with an embodiment.

Referring now to FIG. 6, in one example, a computer program product 600 includes, for instance, one or more storage media 602, wherein the media may be tangible and/or non-transitory, to store computer readable program code means or logic 604 thereon to provide and facilitate one or more aspects of embodiments described herein.

Technical effects and benefits include reduction in the messages that are required during distributed processing of a graph.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

Further, as will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium (s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for subgraph-based distributed graph processing, comprising:
   receiving an input graph comprising a plurality of vertices and edges;
   partitioning the input graph into a plurality of subgraphs, each subgraph comprising internal vertices that are owned by the subgraph, and boundary vertices, each of the boundary vertices corresponding an internal vertex that is owned by another subgraph, wherein each vertex in the input graph is owned by a single respective subgraph;

assigning one or more respective subgraphs to each of a plurality of workers of a distributed graph processing system; and initiating processing of the plurality of subgraphs by performing a series of processing steps, wherein a processing step comprises:

processing the internal vertices and boundary vertices internally within each of the subgraphs, wherein each of the workers performs the internal processing of each worker's respective one or more subgraphs;

detecting that a change was made to a boundary vertex of a first subgraph during the internal processing; and sending a message from a first worker to which the first subgraph is assigned to a second worker to which a second subgraph is assigned in response to detecting the change that was made to the boundary vertex of the first subgraph;

determining whether the first worker and the second worker are the same worker;

based on determining that the first worker and the second worker are the same worker, sending the message via an internal buffer memory of the first worker; and based on determining that the first worker and the second worker are different workers, sending the message via a network that connects the plurality of workers in the distributed graph processing system; and wherein the first worker comprises a plurality of processing threads, and processes a respective plurality of subgraphs concurrently using the plurality of processing threads, and further comprising:

based on sending the message via the internal buffer memory of the first worker, accessing the message asynchronously in the second subgraph during a same processing step in which the message was sent.

2. The method of claim 1, wherein each of the boundary vertices in a subgraph is directly connected to at least one of the internal vertices in the subgraph via an edge.

3. The method of claim 1, wherein the second subgraph owns an internal vertex corresponding to the boundary vertex to which the change was made in the first subgraph, and wherein the internal vertex in the second subgraph comprises a master copy of vertex information of the internal vertex.

4. The method of claim 3, further comprising updating the vertex information of the internal vertex in the second subgraph based on the message in a subsequent processing step.

5. The method of claim 1, wherein each of the vertices in the input graph comprises a unique vertex identifier, and wherein the internal vertices of each subgraph comprise a respective range of consecutive vertex identifiers.

6. The method of claim 1, wherein each of the vertices comprises vertex attributes comprising a wrapper class type, and further comprising:

converting the vertex attributes from the wrapper class type to a primitive type during the partitioning; and converting a collection of objects of the wrapper class type of a vertex into an array data structure using the primitive type during the partitioning.

7. A computer program product for subgraph-based distributed graph processing, the computer program product comprising:

a non-transitory computer readable storage medium having program code embodied therewith, the program code executable by a processor for:

receiving an input graph comprising a plurality of vertices and edges;

partitioning the input graph into a plurality of subgraphs, each subgraph comprising internal vertices that are owned by the subgraph, and boundary vertices, each of the boundary vertices corresponding an internal vertex that is owned by another subgraph, wherein each vertex in the input graph is owned by a single respective subgraph;

assigning one or more respective subgraphs to each of a plurality of workers of a distributed graph processing system; and initiating processing of the plurality of subgraphs by performing a series of processing steps, wherein a processing step comprises:

processing the internal vertices and boundary vertices internally within each of the subgraphs, wherein each of the workers performs the internal processing of each worker's respective one or more subgraphs;

detecting that a change was made to a boundary vertex of a first subgraph during the internal processing; and sending a message from a first worker to which the first subgraph is assigned to a second worker to which a second subgraph is assigned in response to detecting the change that was made to the boundary vertex of the first subgraph;

determining whether the first worker and the second worker are the same worker;

based on determining that the first worker and the second worker are the same worker, sending the message via an internal buffer memory of the first worker; and based on determining that the first worker and the second worker are different workers, sending the message via a network that connects the plurality of workers in the distributed graph processing system; and wherein the first worker comprises a plurality of processing threads, and processes a respective plurality of subgraphs concurrently using the plurality of processing threads, and further comprising:

based on sending the message via the internal buffer memory of the first worker, accessing the message asynchronously in the second subgraph during a same processing step in which the message was sent.

8. The computer program product of claim 7, wherein each of the boundary vertices in a subgraph is directly connected to at least one of the internal vertices in the subgraph via an edge.

9. The computer program product of claim 7, wherein the second subgraph owns an internal vertex corresponding to the boundary vertex to which the change was made in the first subgraph, and wherein the internal vertex in the second subgraph comprises a master copy of vertex information of the internal vertex.

10. The computer program product of claim 9, further comprising updating the vertex information of the internal vertex in the second subgraph based on the message in a subsequent processing step.

11. The computer program product of claim 7, wherein each of the vertices in the input graph comprises a unique vertex identifier, and wherein the internal vertices of each subgraph comprise a respective range of consecutive vertex identifiers.

12. A system for subgraph-based distributed graph processing comprising:

a distributed graph processing system comprising a plurality of workers connected by a network, the distributed graph processing system configured to:

receive an input graph comprising a plurality of vertices and edges;

partition the input graph into a plurality of subgraphs, each subgraph comprising internal vertices that are owned by the subgraph, and boundary vertices, each of the boundary vertices corresponding an internal vertex that is owned by another subgraph, wherein each vertex in the input graph is owned by a single respective subgraph;

assign one or more respective subgraphs to each of the plurality of workers of the distributed graph processing system; and initiate processing of the plurality of subgraphs by performing a series of processing steps, wherein a processing step comprises:

processing the internal vertices and boundary vertices internally within each of the subgraphs, wherein each of the workers performs the internal processing of each worker's respective one or more subgraphs;

detecting that a change was made to a boundary vertex of a first subgraph during the internal processing; and sending a message from a first worker to which the first subgraph is assigned to a second worker to which a second subgraph is assigned in response to detecting the change that was made to the boundary vertex of the first subgraph;

determine whether the first worker and the second worker are the same worker;

based on determining that the first worker and the second worker are the same worker, sending the message via an internal buffer memory of the first worker; and based on determining that the first worker and the second worker are different workers, sending the message via the network that connects the plurality of workers in the distributed graph processing system; and wherein the first worker comprises a plurality of processing threads, and processes a respective plurality of subgraphs concurrently using the plurality of processing threads, and further comprising:

based on sending the message via the internal buffer memory of the first worker, accessing the message asynchronously in the second subgraph during a same processing step in which the message was sent.

13. The system of claim 12, wherein the second subgraph owns an internal vertex corresponding to the boundary vertex to which the change was made in the first subgraph, and wherein the internal vertex in the second subgraph comprises a master copy of vertex information of the internal vertex.

14. The system of claim 13, further comprising updating the vertex information of the internal vertex in the second subgraph based on the message in a subsequent processing step.

* * * * *